United States Patent
Ueda

(10) Patent No.: US 9,596,780 B2
(45) Date of Patent: Mar. 14, 2017

(54) STRUCTURE FOR MAINTAINING ORIENTATION OF SUBSTRATE WITH RESPECT TO CASING

(71) Applicant: TOYOTA JIDOSHA KABUSHIKI KAISHA, Toyota-shi, Aichi-ken (JP)

(72) Inventor: Kazuhiko Ueda, Seto (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/059,764

(22) Filed: Mar. 3, 2016

(65) Prior Publication Data

US 2016/0295734 A1 Oct. 6, 2016

(30) Foreign Application Priority Data

Mar. 31, 2015 (JP) .................................. 2015-071634

(51) Int. Cl.
*A47K 5/00* (2006.01)
*H05K 7/14* (2006.01)

(52) U.S. Cl.
CPC .................. *H05K 7/1432* (2013.01)

(58) Field of Classification Search
USPC ....................................................... 248/213.2
See application file for complete search history.

(56) References Cited

U.S. PATENT DOCUMENTS

| | | | |
|---|---|---|---|
| 9,309,907 B2* | 4/2016 | Chitaka | H05K 7/14 |
| 2005/0190539 A1* | 9/2005 | Watanabe | H05K 7/20854 361/704 |
| 2006/0152907 A1* | 7/2006 | Rathmann | H02K 11/33 361/720 |
| 2011/0155485 A1* | 6/2011 | Tsurumi | H01M 2/0237 180/65.1 |
| 2014/0246768 A1* | 9/2014 | Soyano | H01L 23/4006 257/691 |
| 2014/0367182 A1* | 12/2014 | Yoshinaga | B60L 11/1898 180/68.4 |

FOREIGN PATENT DOCUMENTS

| | | |
|---|---|---|
| JP | 2012-064875 A | 3/2012 |
| JP | 2013-030291 A | 2/2013 |
| JP | 2013-065695 A | 4/2013 |

* cited by examiner

*Primary Examiner* — Monica Millner
(74) *Attorney, Agent, or Firm* — Oliff PLC

(57) ABSTRACT

A structure is provided for a PCU (power control unit) in which components secured inside a casing are electrically connected to electronic components on a circuit substrate by a connector, the structure being adapted to maintain the orientation of the circuit substrate to remove the circuit substrate from the casing or to mount the circuit substrate to the casing. Direction control pins are fitted into cover securing holes provided in the casing to secure a cover to the casing. A gripping jig includes grips for gripping the circuit substrate and guide holes into which the direction control pins are inserted. The direction of movement of the gripping jig is controlled by the direction control pins inserted into the guide holes.

4 Claims, 19 Drawing Sheets

STRUCTURE FOR MAINTAINING ORIENTATION OF SUBSTRATE WITH RESPECT TO CASING

BACKGROUND OF THE INVENTION

1. Field of the Invention

The present invention relates to a structure for maintaining the orientation of a circuit substrate with respect to a casing when the circuit substrate is removed from the casing or when the circuit substrate is mounted to the casing.

2. Description of the Related Art

Recently, hybrid vehicles and electric vehicles in which an electric motor is mounted as a drive source have been developed. A power control unit mounted on a vehicle boosts the dc voltage of the power supply, generates three-phase ac power from the raised do voltage, and supplies the ac power to the electric motor.

The power control unit houses, in a casing, components such as switching elements for a boost converter and an inverter, a reactor, a capacitor, sensors, and a cooler, and houses a circuit substrate in which electronic components for controlling the switching elements based on values detected by the sensors. The opening of the casing is covered by a cover. The casing and the cover are secured to each other by a fastening bolt.

Patent document 1 discloses an electronic controller provided with a case provided with fitting pins and an electronic circuit substrate having fitting holes into which fitting pins are fitted. In this electronic controller, the fitting pins and the fitting holes are arranged so as to be rotationally asymmetric as seen in a direction in which the electronic circuit substrate is assembled to the case, so as to prevent an error in assembling the electronic circuit substrate to the case.

[patent document 1] JP2012-64875

Other than the power control unit (PCU), a number of electronic control units (ECU) are mounted in a vehicle as electronic controllers. Like the PCU, the ECUs are configured by housing a circuit substrate in a casing. The electronic components on the circuit substrate and the components in the casing are often electrically connected by solder. Therefore, when the circuit substrate is broken, the job of removing the solder and detaching the broken circuit substrate from the casing will be necessary in order to replace the circuit substrate alone. To mount a new circuit substrate in the casing, the job of soldering the electronic components on the circuit substrate to the components in the casing will be necessary. The components are replaced by hand by a mechanic at a dealer. In the current practice, the circuit substrate is not replaced alone because it is inefficient to do so, and the entirety of the ECU, including the case, is replaced.

This is also true in the case of a PCU. When a circuit substrate for a PCU is broken, the entirety of the PCU, including the case, is replaced instead of replacing the circuit substrate alone. However, the price of the entirety of the PCU is considerably higher than the entirety of the ECU. It is therefore preferable to replace the circuit substrate alone if the circuit substrate is broken. It is also preferable, in electronic controllers other than a PCU, to replace the circuit substrate alone instead of replacing the entirety of the controller, including the casing, provided that the job of replacement is made easier.

SUMMARY OF THE INVENTION

The present invention addresses the aforementioned issue and a purpose thereof is to provide a structure for maintaining the orientation of a circuit substrate with respect to a casing when an operator such as a mechanic removes the circuit substrate from the casing of an electronic controller or mounts the circuit substrate to the casing of an electronic controller.

An embodiment of the present invention that addresses the above issue relates to a structure adapted for an electronic controller in which components secured inside a casing and electronic components on a circuit substrate are electrically connected by a connector, capable of maintaining the orientation of the circuit substrate with respect to the casing when the circuit substrate is removed from the casing or when the circuit substrate is mounted to the casing. The structure of the embodiment includes a direction control pin fitted into a cover securing hole provided in the casing to secure a cover to the casing, and a gripping jig including a grip for gripping the circuit substrate. The gripping jig includes a guide hole into which the direction control pin is inserted, and the direction of movement of the gripping jig is controlled by the direction control pin inserted into the guide hole.

According to this embodiment, components secured inside the casing and electronic components on the circuit substrate are electrically connected by the connector in the electronic controller. It is therefore possible to electrically disconnect the components secured inside the casing from the electronic components on the circuit substrate by removing the connector from the signal terminals of the casing, and to electrically connect the components secured inside the casing to the electronic components on the circuit substrate by mounting the connector to the signal terminals. In further accordance with this embodiment, the direction of movement of the gripping jig gripping the circuit substrate is controlled by the direction control pin so that the operator can maintain the orientation of the circuit substrate constant when the circuit substrate is replaced. Since the direction control pin is fitted into the cover securing hole, it is not necessary to form a hole for the direction control pin separately.

It is favorable that at least three direction control pins be fitted into different cover securing holes while the circuit substrate is being replaced. By guiding the direction of movement of the gripping jig using at least three direction control pins, the orientation of the circuit substrate can be maintained in a more stable manner.

It is favorable that the grip be supported by the gripping jig so as to be elastically deformable and grips an edge of the circuit substrate. By configuring the grip to be elastically deformable, the circuit substrate can be gripped and released easily.

The guide hole of the gripping jig may be formed of a metal material. By forming the guide hole of the metal material, the direction control pin is prevented from becoming loose in the guide hole.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described by reference to the preferred embodiments. This does not intend to limit the scope of the present invention, but to exemplify the invention.

Figure 1:
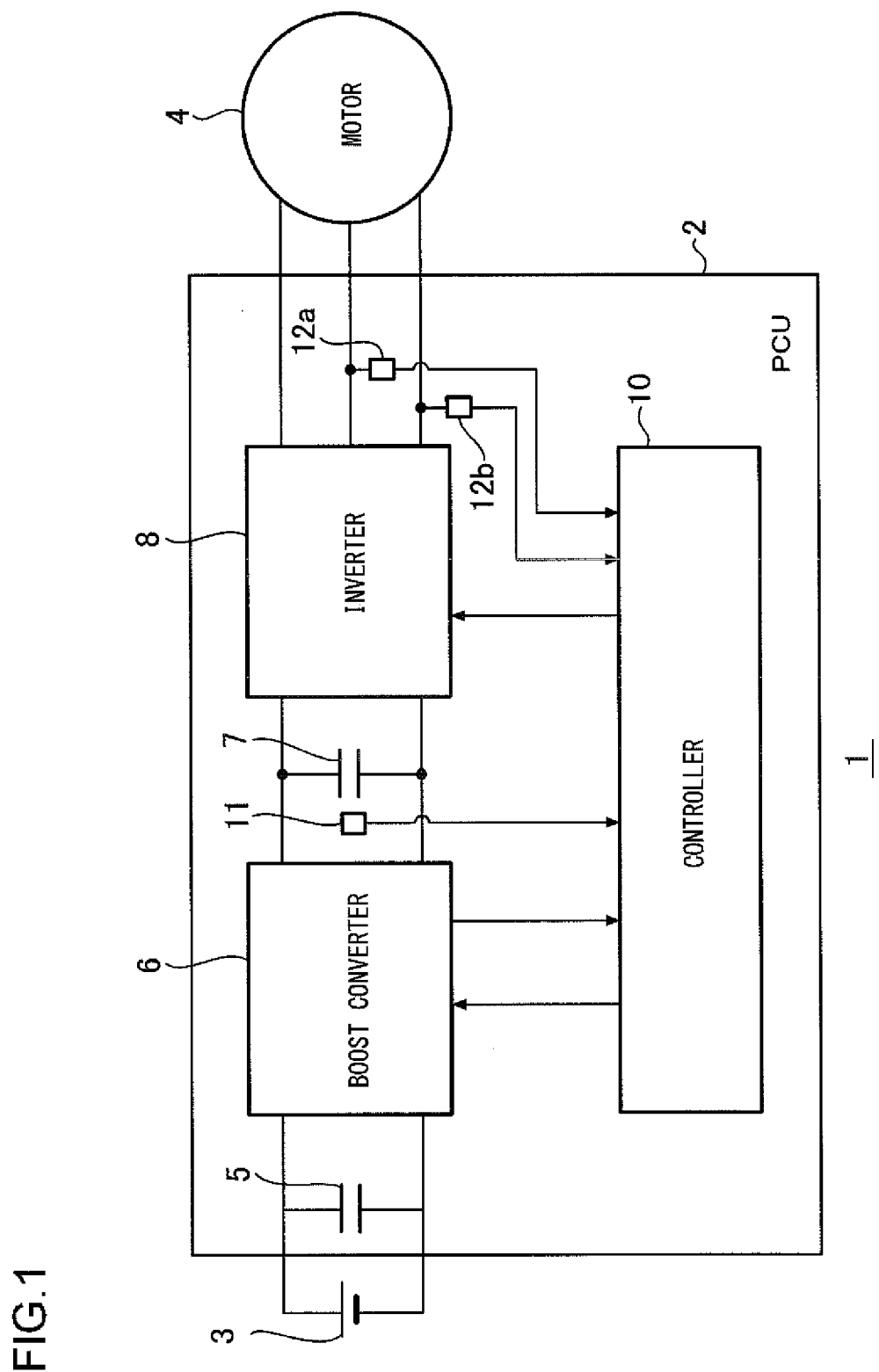
FIG. 1 shows a motor control system for a vehicle provided with an electric motor as a drive source for vehicle traveling.

FIG. 1 shows a motor control system for a vehicle such as a hybrid vehicle provided with an electric motor as a drive source for vehicle traveling. The motor control system 1 is provided with a power control unit (PCU) 2, a power supply 3, and a motor 4. FIG. 1 shows one motor 4 but the motor control system 1 may be provided with a plurality of motors 4.

The PCU 2 is provided with a filter capacitor 5, a boost converter 6, a smoothing capacitor 7, an inverter 8, and a controller 10. The PCU 2 is provided with a group of sensors including a voltage sensor 11 for detecting the voltage across the smoothing capacitor 7, and current sensors 12a and 12b for detecting the motor currents through the V-phase coil and the W-phase coil of the motor 4. The PCU 2 may further be provided with a temperature sensor for detecting the temperature of the boost converter 6 and the inverter 8 and a current sensor for detecting the current through a reactor of the boost converter 6. The detected values from the sensors are output to the controller 10 at a predetermined point of time.

The controller 10 controls the boost converter 6 to boost the dc voltage of the power supply 3 in accordance with a motor torque command from a travel control ECU (not shown) and controls the inverter 8 to convert the dc power into three-phase ac power and supply the three-phase ac power to the motor 4. The filter capacitor 5 is connected in parallel between the power supply 3 and the boost converter 6 and has a function of smoothing the do voltage of the power supply 3.

The boost converter 6 includes a reactor and a switching element and is connected to the power supply 3 via the filter capacitor 5. The boost converter 6 includes a current sensor for detecting the current through the reactor and outputs the detected current value to the controller 10. The switching element performs a switching operation according to a gate signal supplied from the controller 10 and boosts the low do voltage of the filter capacitor 5 to a high dc voltage.

The smoothing capacitor 7 is provided between the boost converter 6 and the inverter 8, smooths the dc voltage boosted by the boost converter 6, and stores the charge of the do voltage. The voltage sensor 11 detects the voltage across the smoothing capacitor 7 and outputs the detected voltage value to the controller 10. The inverter 8 includes switching elements and performs a switching operation according to gate signals for the switching elements for the respective phases (U-phase, V-phase, and W-phase) of the motor 4 supplied from the controller 10 so as to convert the dc power into three-phase ac power and supply the ac power to the motor 4.

The controller 10 is comprised of electronic components such as a microcomputer and a memory. These electronic components are mounted on a circuit substrate. In response to a motor torque command, the controller 10 supplies gate signals to the boost converter 6 and the inverter 8 based on the detected values output from the sensors so as to control the respective switching elements.

A description will now be given of the structure of the PCU 2. The PCU 2 is formed by mounting the circuit substrate to a casing having an opening and covering the opening of the casing by a cover. In an exemplary embodiment, the PCU 2 is illustrated by way of an example of an electronic controller.

Figure 2:
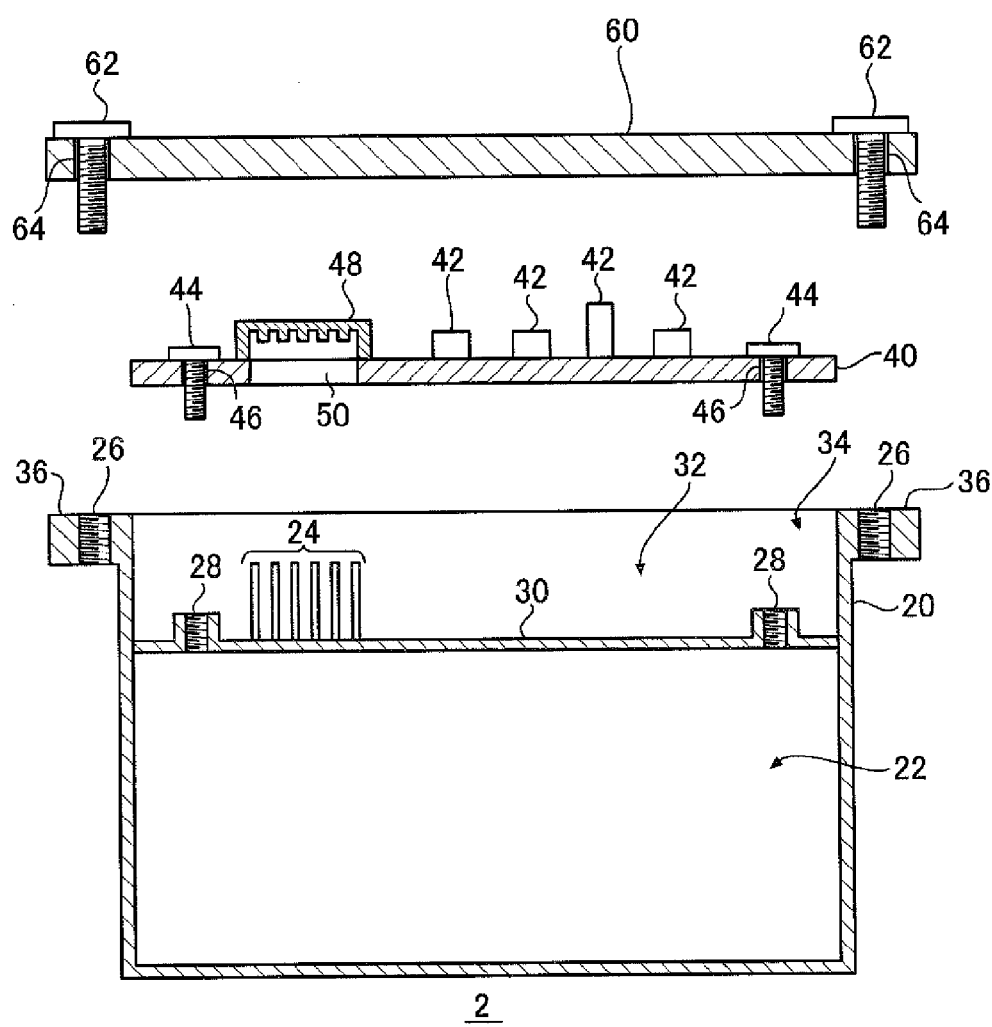
FIG. 2 shows components of the PCU.

FIG. 2 shows components of the PCU 2. FIG. 2 schematically shows the cross section of the components.

The PCU 2 is formed by a casing 20, a circuit substrate 40, and a cover 60. The casing 20 has a shape of a box having an opening 34 in the topmost part. A housing space 22 of the casing 20 houses components such as the filter capacitor 5, the boost converter 6, the smoothing capacitor 7, the inverter 8, the voltage sensor 11, the current sensor 12, and the cooler (not shown). A supply pipe and an exhaust pipe for supplying a coolant are mounted to the side wall of the casing 20 (not shown). Above the housing space 22 is formed a housing space 32 that opens in the opening 34 and that is configured to house the circuit substrate 40. A partition plate 30 provides a partition between the housing space 22 and the housing space 32.

Referring to FIG. 1, the controller 10 formed in the circuit substrate 40 exchanges signals with the switching elements of the boost converter 6 and the inverter 8 and with the sensors, which are housed in the housing space 22. Exchange of signals is achieved by one or more connectors 48 provided in the circuit substrate 40 being electrically connected to a plurality of signal terminals 24 provided to stand on the partition plate 30. The signal terminals 24 are connected to the components housed in the housing space 22 and the connectors 48 are connected to the electronic components 42 mounted on the circuit substrate 40. Thus, the PCU 2 is configured such that the components fixed inside the casing 20 and electronic components 42 of the circuit substrate 40 are electrically connected by the connectors 48.

The connector 48 is formed as a female connector. By pushing the connector 48 down along the signal terminals 24 projecting upward and having a shape of a male terminal, the connector 48 and the signal terminals 24 are electrically connected. In the PCU 2 according to the exemplary embodiment, electrically connection is achieved by fitting the connector 48 and the signal terminals 24 together instead of electrically connecting the components secured inside the casing 20 with the electronic components 42 of the circuit substrate 40 by solder. By employing such a connection structure, an operator such as a mechanic can easily remove a broken circuit substrate 40 from the casing 20 or easily mount a new circuit substrate 40 to the casing 20.

The partition plate 30 is provided with a plurality of substrate securing holes 28 for fastening the circuit substrate 40 by bolts. The substrate securing holes 28 are formed to project from the partition plate 30 and have a role as a spacer that forms a gap between the circuit substrate 40 and the partition plate 30 when the circuit substrate 40 is mounted to the casing 20. A plurality of cover securing holes 26 for fastening the cover 60 by bolts are provided at edges 36 on the topmost part of the casing 20.

Figure 3:
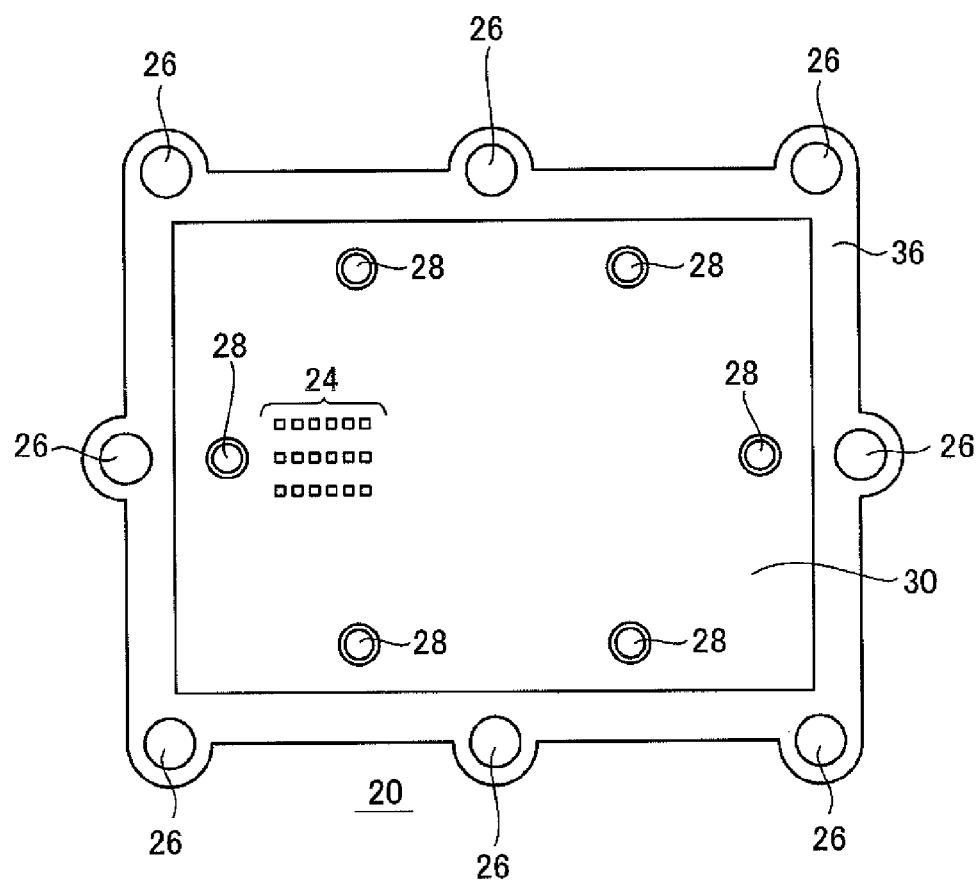
FIG. 3 shows the top surface of the casing, which is one of the components of the PCU.

FIG. 3 shows the top surface of the casing 20, which is one of the components of the PCU 2. The edge 36 of the casing 20 is worked to have high flatness in order to make the PCU 2 waterproof. The plurality of cover securing holes 26 are provided at the edge 36. In this example, a total of 8 cover securing holes 26 are provided at the four corners of the edge 36 and between the adjacent corners. A larger number of cover securing holes 26 may be provided in order to improve the waterproof performance of the PCU 2. Below the opening 34 defined by the inner circumference of the edge 36 is provided the partition plate 30. The plurality of signal terminals 24 are provided to stand on the partition plate 30 and the plurality of substrate securing holes 28 are also provided to stand on the partition plate 30.

Referring back to FIG. 2, the plurality of electronic components 42 are mounted on the circuit substrate 40, forming the controller 10 for controlling the operation of the PCU 2. Bolt holes 46 (a plurality of through hole) are formed in the circuit substrate 40. The circuit substrate 40 is placed on the substrate securing holes 28 such that the bolt holes 46 are aligned with the substrate securing holes 28 on the partition plate 30 and fastened to the casing 20 by bolts 44.

The connector 48 is temporarily mounted above an opening 50 for terminals. After the circuit substrate 40 is mounted on the substrate securing holes 28, the connector 48 is pressed downward along the signal terminals 24 guided through the opening 50 for terminals, thereby engaging the signal terminals 24 with the recesses in the connector 48 and electrically connecting the signal terminals 24 and the connector 48.

Figure 4:
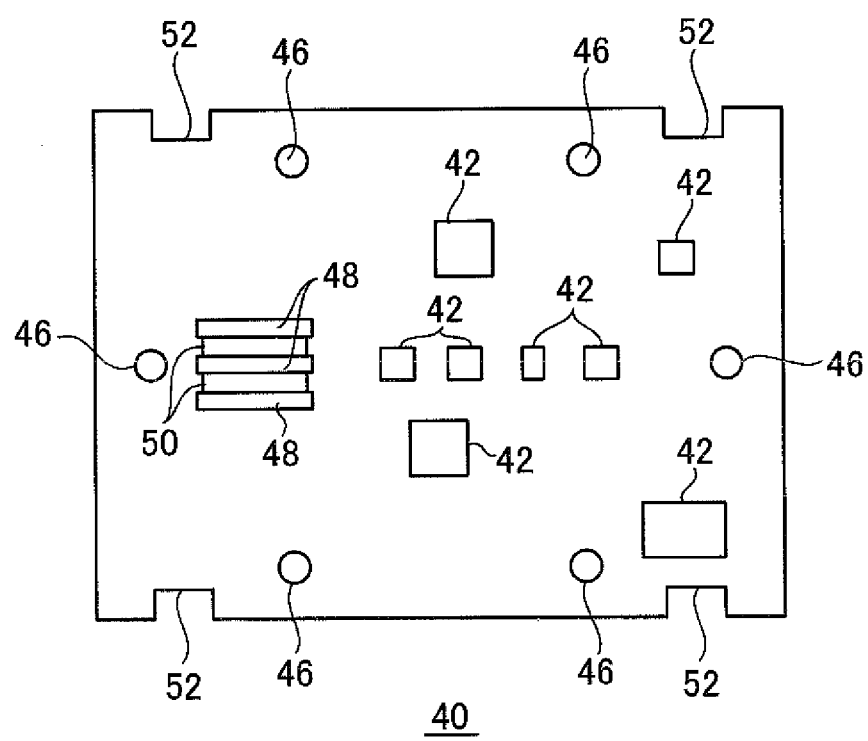
FIG. 4 shows the top surface of the circuit substrate, which is one of the components of the PCU.

FIG. 4 shows the top surface of the circuit substrate 40, which is one of the components of the PCU 2. The plurality of electronic components 42 forming the controller 10 are mounted on the circuit substrate 40. The circuit substrate 40 is provided with the plurality of through bolt holes 46. The bolt holes 46 are formed in alignment with the positions of the substrate securing holes 28 in the partition plate 30 of the casing 20.

A plurality of notches 52 are provided in the outer circumference of the circuit substrate 40. The notches 52 are formed by cutting portions of the rectangular outer circumference of the circuit substrate 40 inward and are provided to be gripped by a special-purpose jig when the circuit substrate 40 is replaced. Preferably, the notches 52 are formed in the neighborhood of the four corners of the rectangular circuit substrate 40 so that the jig can grip the circuit substrate 40 in a stable manner.

Referring back to FIG. 2, the cover 60 is a member for covering the opening 34 of the casing 20. A plurality of through bolt holes 64 are formed at the edge of the cover 60. The cover 60 is placed on the casing 20 such that the bolt holes 64 are aligned with the cover securing holes 26 formed at the edge 36 of the casing 20 and then fastened to the casing 20 by bolts 62.

The underside of the edge portion of the cover 60 in contact with the edge 36 of the casing 20 is worked to have high flatness. By fastening the casing 20 and the cover 60 together by the bolts 62, a waterproof sealed structure results since both have high flatness.

The casing 20, the circuit substrate 40, and the cover 60 are assembled by a robot in a components factory. In assembling the circuit substrate 40 to the casing 20, the robot can align the circuit substrate 40 with the casing 20 with high precision so that the signal terminals 24 are inserted into the opening 50 for terminals in the circuit substrate 40 and the circuit substrate 40 is secured to the casing 20 without the signal terminals 24 interfering with the underside of the circuit substrate 40.

Figure 5:
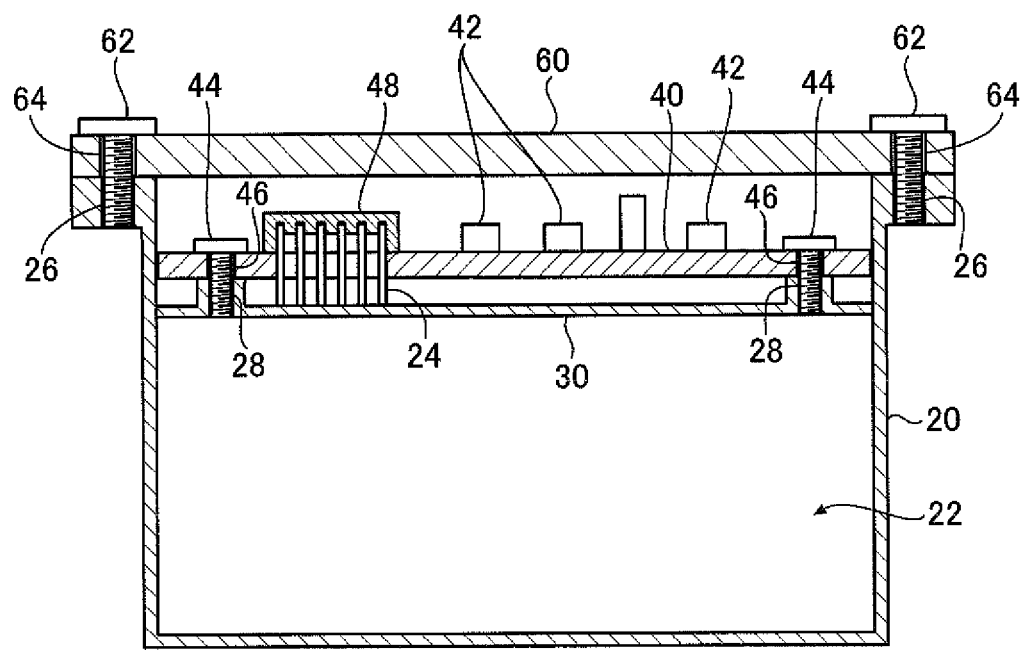
FIG. 5 schematically shows a cross section presented when the components of the PCU are assembled.

FIG. 5 schematically shows a cross section presented when the components of the PCU 2 are assembled. The circuit substrate 40 is mounted to the casing 20 by the bolts 44 and the cover 60 is mounted to the casing 20 by the bolts 62.

As described above, the housing space 22 of the casing 20 houses components such as switching elements (power semiconductor elements), converters, reactors, and sensors so that the casing 20 is expensive. Therefore, the cost to be borne by the vehicle owner is large if the entirety of the PCU 2, including the casing 20, is replaced in the event that the circuit substrate 40 is broken. To address this, the PCU 2 according to the exemplary embodiment is configured such that electrical connection between the components secured inside the casing 20 and the electronic components 42 on the circuit substrate 40 is implemented by the connectors 48, and, when the circuit substrate 40 is broken, the circuit substrate 40 can be easily removed from the casing 20 by pulling the connectors 48 upward to remove it from the signal terminals 24 and removing the bolts 44.

However, the components are removed by hand by an operator at a dealer. It is therefore difficult to maintain the circuit substrate 40 in horizontal orientation when the broken circuit substrate 40 is lifted out from the casing 20.

If the circuit substrate 40 cannot be maintained in horizontal orientation and is tilted while the circuit substrate 40 is being lifted, the inner circumferential edge of the opening 50 for terminals may come into contact with the signal terminals 24 with the result that the signal terminals 24 may be bent. When the signal terminals 24 are bent, the bent upper ends of the signal terminals 24 may come into contact with the underside of the circuit substrate 40 as a new circuit substrate 40 is assembled to the casing 20, preventing the signal terminals 24 from being inserted into the opening 50 for terminals. Similarly, if the circuit substrate 40 cannot be maintained in horizontal orientation and is tilted when a new circuit substrate 40 is being inserted into the casing 20, the upper ends of the signal terminals 24 may come into contact with the underside of the circuit substrate 40, with the result that the signal terminals 24 cannot be inserted into the opening 50 for terminals, preventing the signal terminals 24 and the connector 48 from being connected.

In this exemplary embodiment, there is proposed an orientation maintenance structure for maintaining the orientation of the circuit substrate 40 with respect to, the casing 20 when an operator removes the circuit substrate 40 from the casing 20 or mounts the circuit substrate 40 to the casing 20. The orientation maintenance structure is a structure for maintaining the circuit substrate 40 in horizontal orientation when the circuit substrate 40 is replaced. Hereinafter, the structure will also be referred to as "replacement structure" for the circuit substrate 40. The replacement structure is comprised of direction control pins mounted to the cover securing holes 26 of the casing 20 and a gripping jig for gripping the circuit substrate 40. Preferably, the gripping jig is formed so as to be light weight and inexpensive, using a resin material.

Figure 6A:
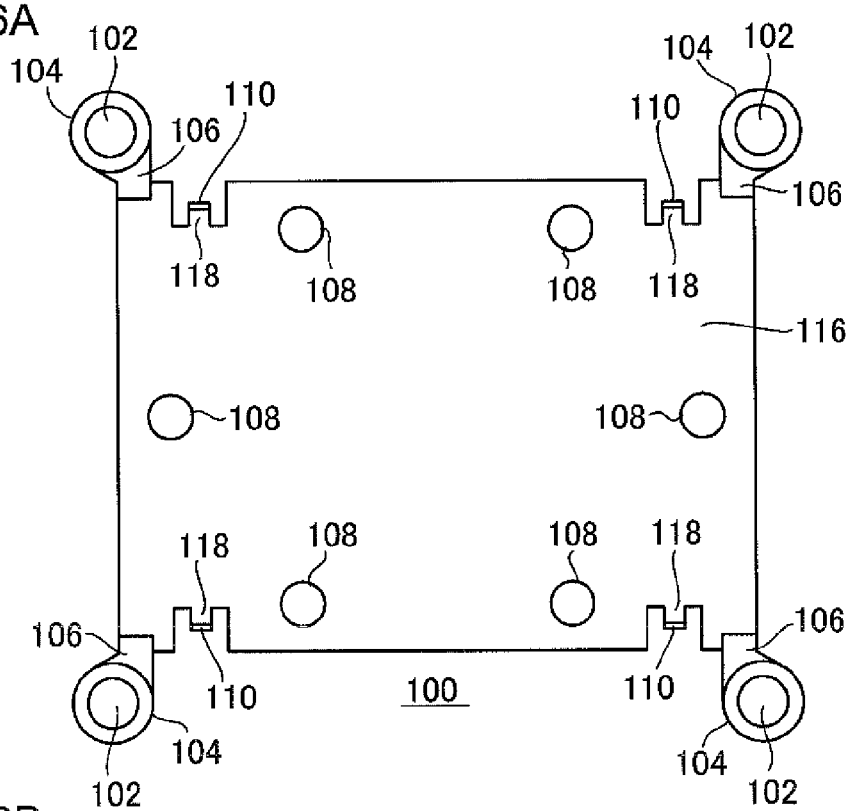
FIGS. 6A-6C shows the structure of the gripping jig.
Figure 6B:
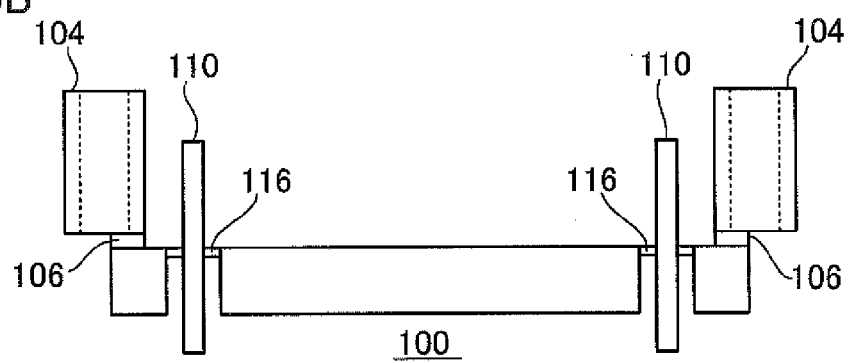
Figure 6C:
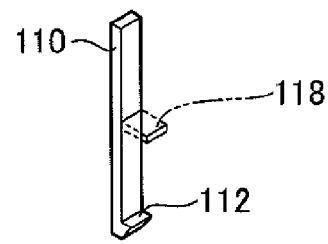

FIGS. 6A-6C show the structure of the gripping jig. FIG. 6A shows the top surface of the gripping jig, FIG. 6B shows the side surface of the gripping jig, and FIG. 60 shows a grip of the gripping jig. The gripping jig 100 is provided with tubes 104 in which guide holes 102 are formed. The guide holes 102 are holes into which the direction control pins are inserted when the circuit substrate 40 is replaced. FIG. 6A shows that the guide holes 102 are provided at the four corners of the gripping jig 100 in alignment with the positions of the cover securing holes 26 at the four corners of the casing 20. The number of guide holes 102 may be equal to the number of direction control pins used when the circuit substrate 40 is replaced.

The casing for the gripping jig 100 is sized such that the gripping jig 100 can be inserted into the housing space 32 from the opening 34 of the casing 20. The jig casing is shaped in a box with an open bottom. The jib body has a space that houses the electronic components 42 and the connectors 48 mounted on the circuit substrate 40 without interfering with the electronic components 42 and the connectors 48 when the gripping jig 100 covers the circuit substrate 40. The tubes 104 are supported by supports 106 such that the guide holes 102 of the tubes 104 are coaxial with the cover securing holes 26 of the casing 20 when the jig casing is inserted into the housing space 32 of the casing 20. The guide holes 102 may have the same diameter as the cover securing holes 26.

A plurality of bolt clearance holes 108 are formed in the jig casing. The bolt clearance holes 108 are through holes and are provided to remove the bolts 44 fastening the circuit substrate 40 and the casing 20 together or to fasten the circuit substrate 40 and the casing 20 together by the bolts 44 while the circuit substrate 40 is being gripped. By allowing an operator to tighten or loosen the bolts 44 via the bolt clearance holes 108 while the gripping jig 100 is gripping the circuit substrate 40, the precision of the position of the circuit substrate 40 relative to the casing 20 as the bolts are tightened or loosened can be secured.

In the event that the height of the connector 48 and the electronic components 42 from the surface of the circuit substrate 40 is so large that the top surfaces of the connector 48 and the electronic components 42 come into contact with the underside of a top plate 116 of the jig casing, recesses or through holes are provided at the associated positions to prevent interference between the top surfaces of the connector 48 and the electronic components 42 with the underside of the top plate 116.

A plurality of levers 110 and grips 112 are formed in a region of the top plate 116 of the jig casing produced by cutting the top plate 116. The lever 110 and the grip 112 are formed as a single piece of plate member and are supported by an elastic support 118 so as to be elastically deformable. The lever 110 is a plate member above the position of support by the elastic support 118 and can be manipulated by an operator. The grip 112 is a plate member below the position of support by the elastic support 118. The grip 112 is latched by the edge of the circuit substrate 40, and, more specifically, the edge of the notch 52 at the lower end of the grip 112 projecting inward.

A plurality of grips 112 are provided at positions aligned with the plurality of notches 52 of the circuit substrate 40. In the illustrated example, two pair of grips 112 that are opposite to each other are provided. As illustrated, four grips 112 are provided in the neighborhood of the four corners of the jig casing. Each of the grips 112 is latched by the underside of the edge of the notch 52 of the circuit substrate 40 so as to grip the circuit substrate 40. By gripping the circuit substrate 40 using the grip 112, the circuit substrate 40 is secured to the gripping jig 100 so that the gripping jig 100 and the circuit substrate 40 can be moved as one piece for replacement of the substrate. Further, the lever 110 and the grip 112 are supported by the elastic support 118 so as to be elastically deformable with respect to the gripping jig 100 so that the circuit substrate 40 can be gripped and released easily.

(Step of Removing the Circuit Substrate 40)

Figure 7:
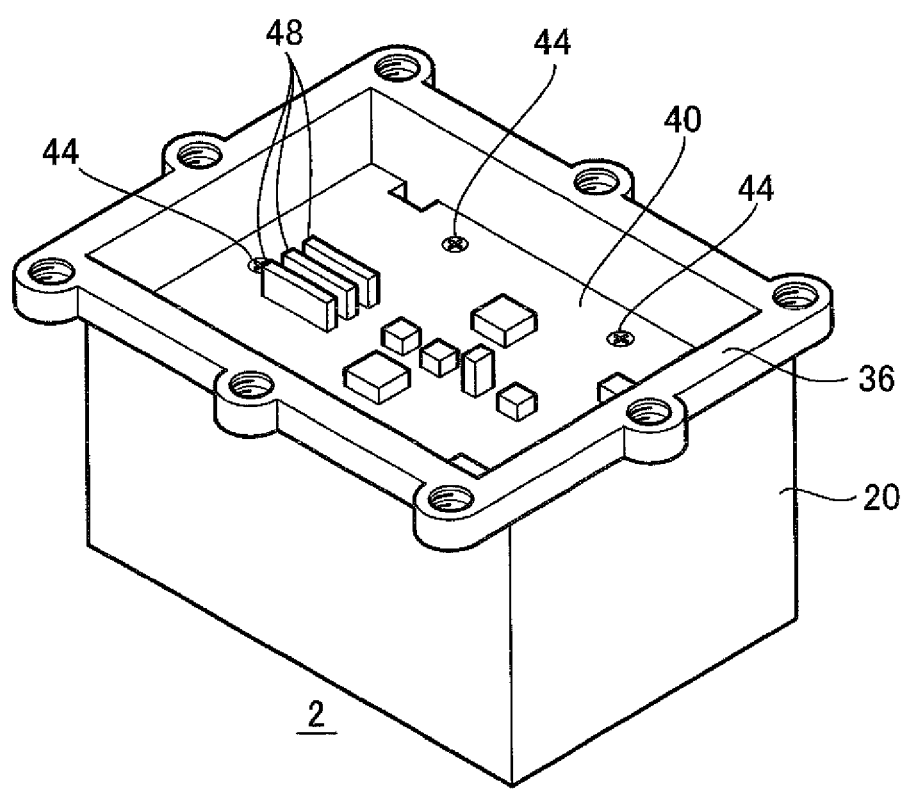
FIG. 7 shows a state occurring when the cover is removed from the casing.

A description will be given of the step of removing the circuit substrate 40 from the casing 20, using the direction control pins and the gripping jig 100. The circuit substrate 40 is removed by an operator by hand. In the removal step, the bolts 62 in the assembled state shown in FIG. 5 are loosened first so as to remove the cover 60 from the casing 20. FIG. 7 shows a state occurring when the cover 60 is removed from the casing 20.

Figure 8:
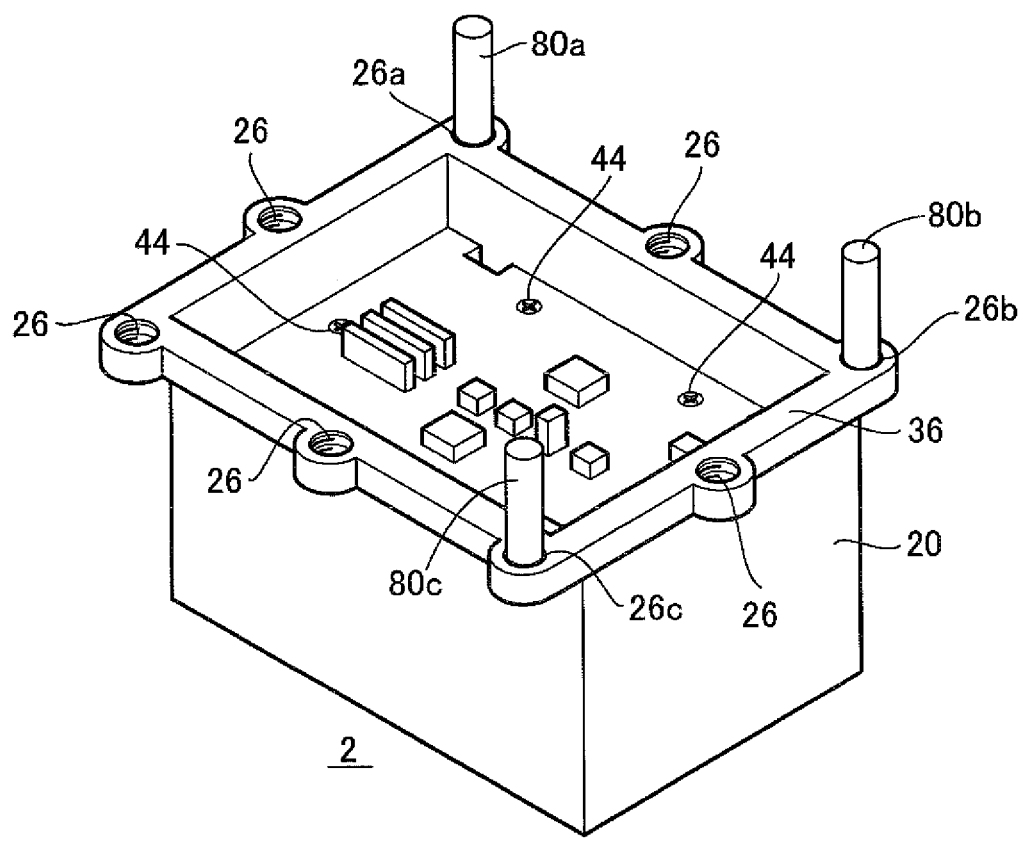
FIG. 8 shows a state in which the direction control pins are secured in the cover securing holes of the casing.

The operator then pulls the connectors 48 upward out of their places so as to disconnect them from the signal terminals 24 and secures the direction control pins 80 in the cover securing holes 26 of the casing 20. FIG. 8 shows a state in which the direction control pins 80 are secured in the cover securing holes 26 of the casing 20. The direction control pins 80 are columnar members having the same diameter as the bolts 62. At least the axial portion of the direction control pins 80 inserted into the cover securing holes 26 is male threaded. The operator screws the direction control pins 80 into the cover securing holes 26, securing the direction control pins 80 so as to be perpendicular to the edge 36. FIG. 8 shows a state in which the direction control pins 80a, 80b, and 80c are fitted into the cover securing holes 26a, 26b, and 26c provided at the respective corners of the edge 36.

By securing the direction control pins 80 to the casing 20 using the cover securing holes 26 provided in the casing 20 for the purpose of securing the cover 60 to the casing 20, it is not necessary to provide holes dedicated to the purpose of securing the direction control pins 80 separately. Further, since the edge 36 formed with the cover securing holes 26 is worked to have high flatness, the direction control pins 80 can be provided so as to be perpendicular to the edge 36 with high precision. The cover securing holes 26 receives the bolts 62 until the moment that the direction control pins 80 are inserted, no foreign materials such as sand or mud is attached to the neighborhood of the cover securing holes 26. This provides an added advantage in that no foreign materials enter the housing space 32 of the casing 20 when the direction control pins 80 are inserted into or dislocated from the cover securing holes 26.

Figure 9:
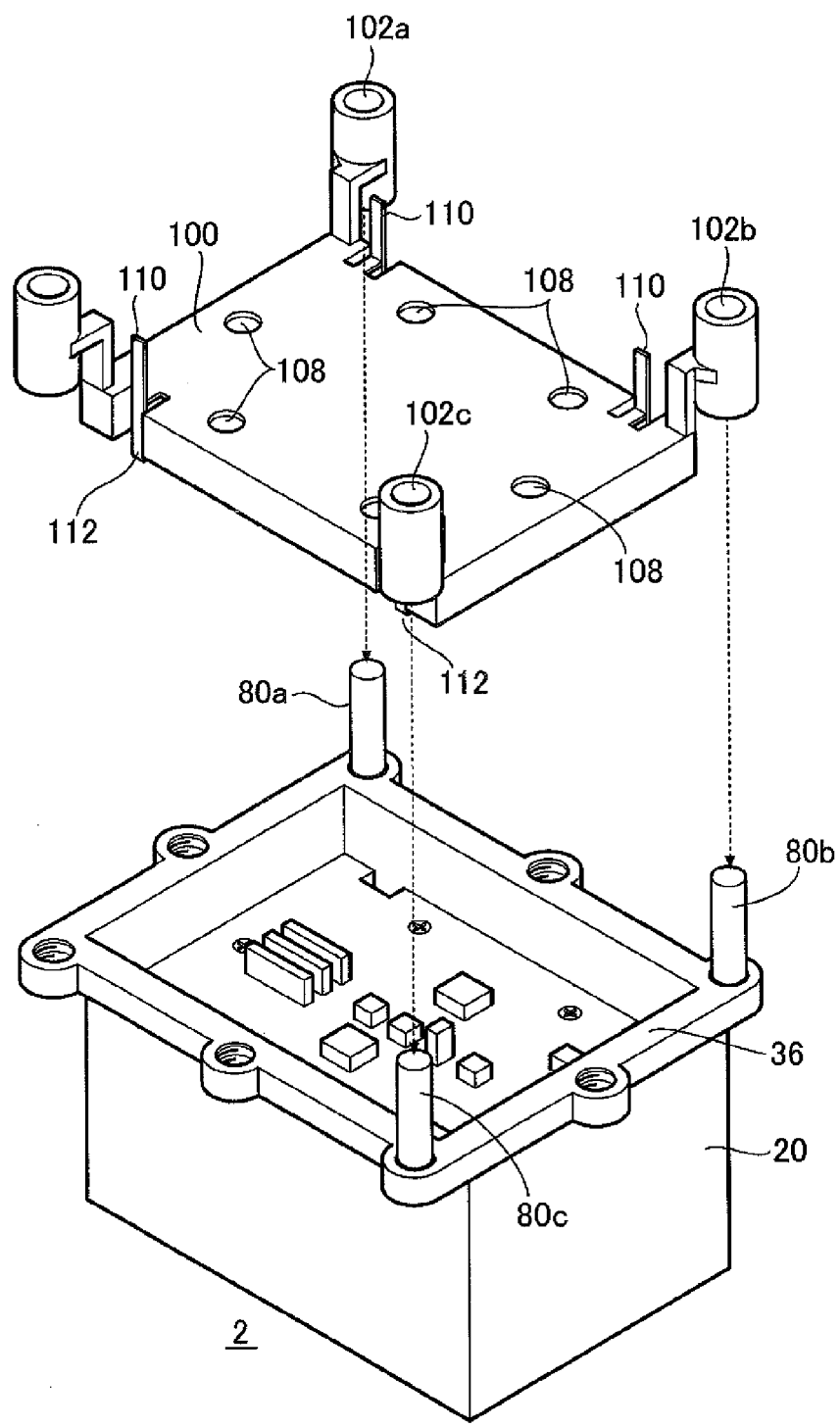
FIG. 9 shows a state in which the gripping jig is placed above the casing.

The operator picks up the gripping jig 100 and places it above the casing 20. FIG. 9 shows a state in which the gripping jig 100 is placed above the casing 20. The operator causes the gripping jig 100 to approach the casing 20 slowly so as to insert the direction control pin 80a into the guide hole 102a, the direction control pin 80b into the guide hole 102b, and the direction control pin 80c into the guide hole 102c.

Figure 10:
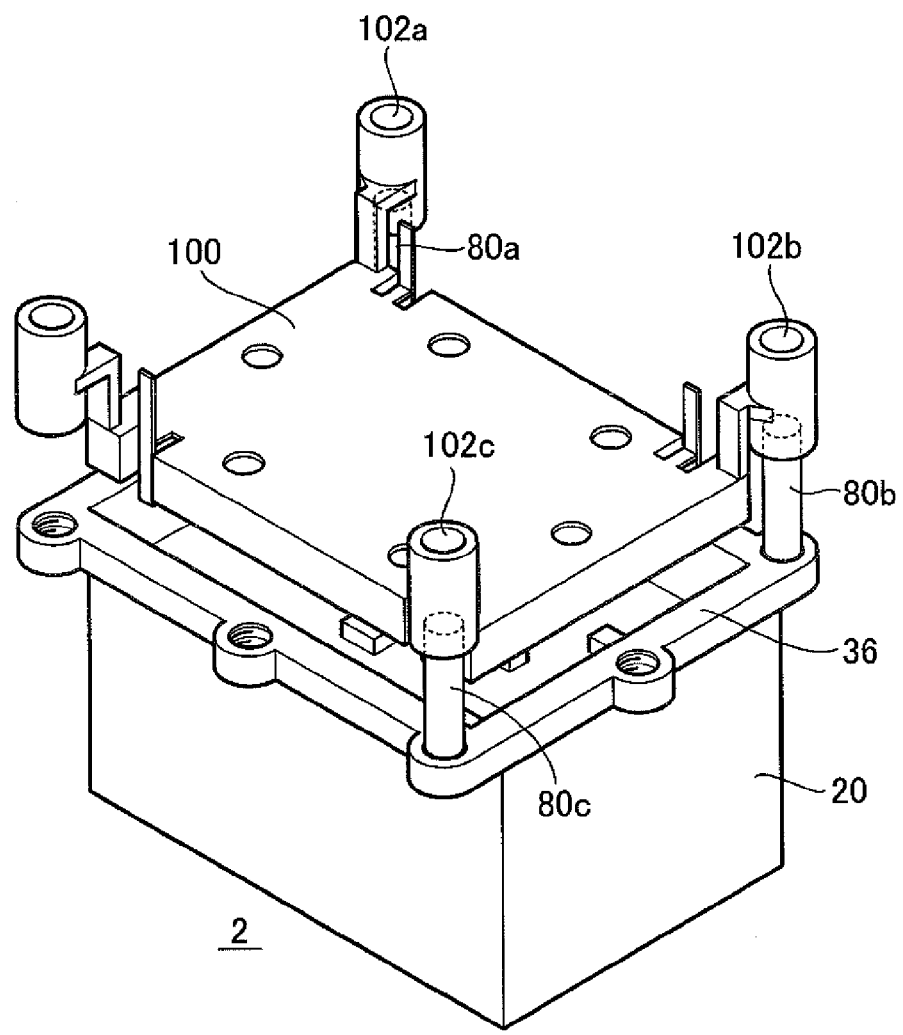
FIG. 10 shows a state in which the direction control pins are partially inserted into the guide holes.

FIG. 10 shows a state in which the direction control pins 80 are partially inserted into the guide holes 102. Since the direction control pins 80 are provided so as to be perpendicular to the edge 36 of the casing 20, the gripping jig 100 is maintained in an orientation perpendicular to the direction control pins 80, i.e., an orientation perfectly horizontal with respect the casing 20, as the direction control pins 80 are inserted into the guide holes 102. The operator lowers the gripping jig 100 slowly until the lower end of the gripping jig comes into contact with the circuit substrate 40.

Figure 11:
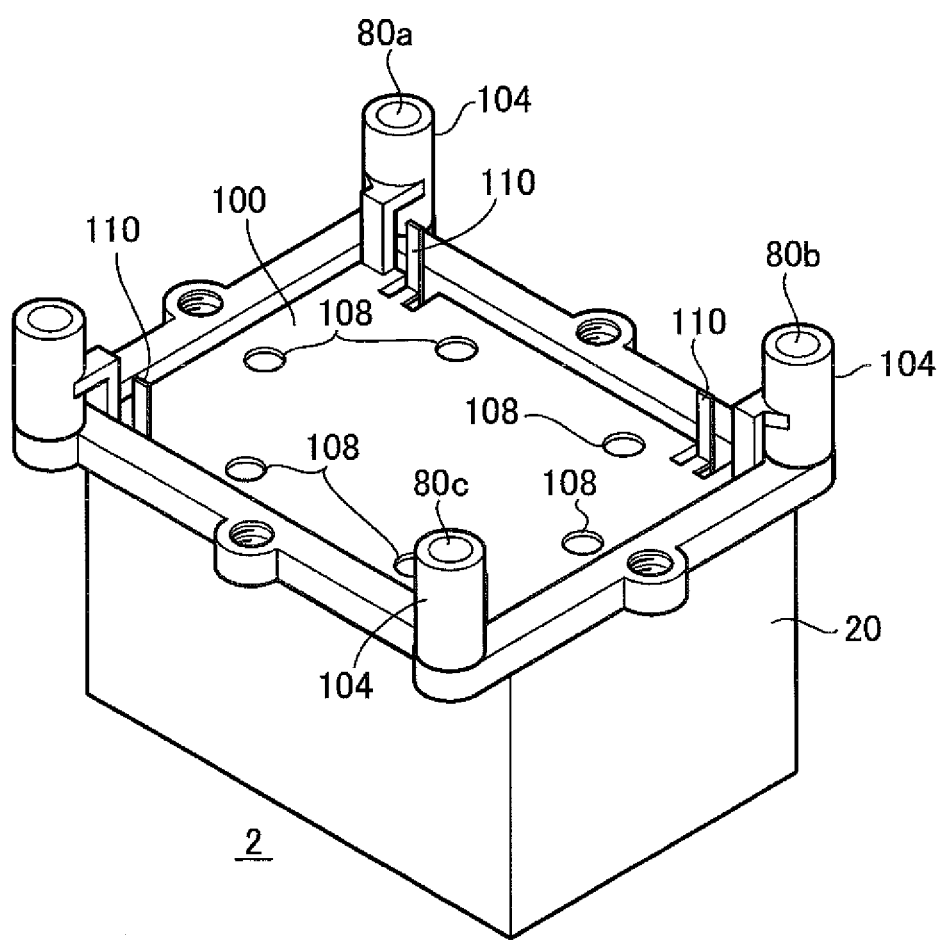
FIG. 11 shows a state in which the lower end of the gripping jig is in contact with the circuit substrate.

FIG. 11 shows a state in which the lower end of the gripping jig 100 is in contact with the circuit substrate 40. When the gripping jig 100 is lowered until the lower end thereof comes into contact with the circuit substrate 40, the lower ends of the grips 112 projecting inward from the grips 112 are latched by the notches 52 of the circuit substrate 40.

Figure 12:
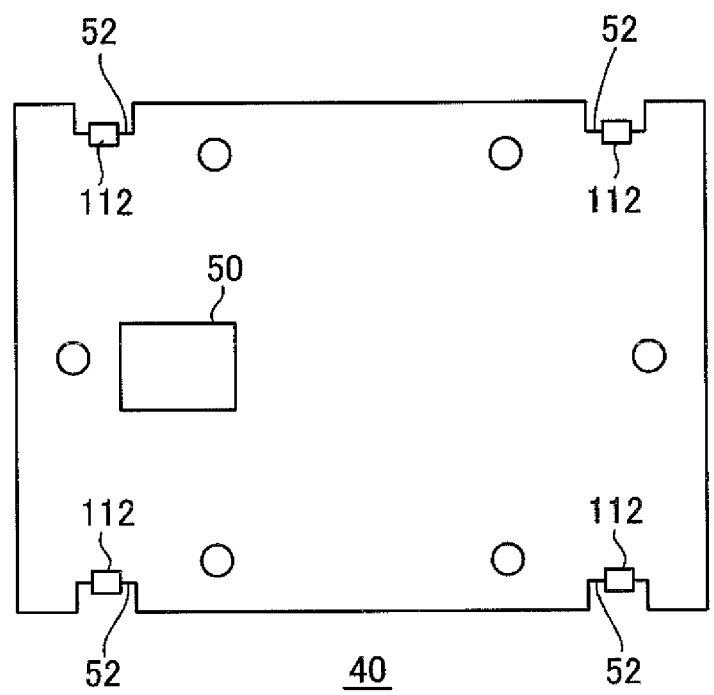
FIG. 12 shows a state in which the grips are latched by the notches on the underside of the circuit substrate.

FIG. 12 shows a state in which the grips 112 are latched by the notches 52 on the underside of the circuit substrate 40. In FIG. 12, illustration of the other components is omitted. As described above, the lever 110 and the grip 112 are supported by the elastic support 118 so as to be elastically deformable with respect to the top plate 116. When the inward projection at the lower end of the grip 112 comes into contact with the edge of the notch 52 before the lower end of the gripping jig 100 comes into contact with the circuit substrate 40, the grip 112 is deformed in a direction away from the edge of the notch 52. When the lower end of the gripping jig 100 comes into contact with the circuit substrate 40, the inward projection gets over the edge of the notch 52, enters a space below the circuit substrate 40, and is latched by the notch 52. In this way, the grips 112 grip the edges of the circuit substrate 40. In a state in which the grips 112 grip the circuit substrate 40, the operator removes from the bolt clearance holes 108 the bolts 44 fastening the circuit substrate 40 and the casing 20 together. By allowing the operator to remove the bolts 44 while the grips 112 grip the circuit substrate 40, the precision of the position of the circuit substrate 40 relative to the casing 20 is maintained while the bolts are being removed.

In the removal step described above, the connectors 48 are disconnected from the signal terminals 24 before the gripping jig 100 is inserted into the casing 20. Alternatively, the connectors 48 may be disconnected after the gripping jig 100 is lowered into the casing 20. In this case, an opening for the connectors 48 may be provided in the top plate 116 of the gripping jig 100. The operator may lower the gripping jig 100 into the casing 20 before lifting the connectors 48 above via the opening for the connector, thereby disconnecting the connectors 48 from the signal terminals 24.

Once the bolts 44 are removed, the operator lifts the gripping jig 100 gripping the circuit substrate 40 upward.

Figure 13:
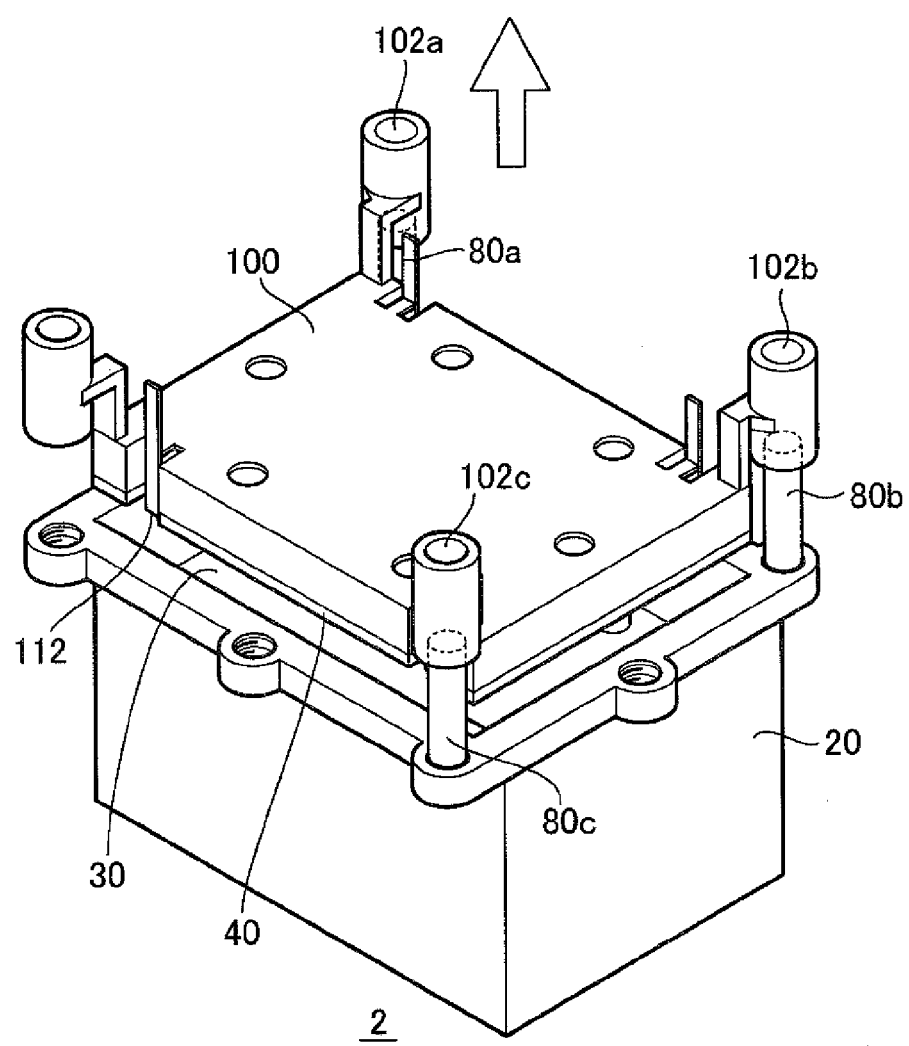
FIG. 13 shows a state in which the gripping jig is lifted upward.

FIG. 13 shows a state in which the gripping jig 100 is lifted upward. As illustrated, the circuit substrate 40 is gripped by the gripping jig 100 and is lifted upward along with the gripping jig 100. The gripping jig 100 gripping the circuit substrate 40 is moved along the direction control pins 80 inserted into the guide holes 102. Thereby, the direction of lifting the gripping jig 100 is accurately guided by the direction control pins 80 and the direction of movement of the gripping jig 100 is controlled. In other words, the direction of movement of the gripping jig 100 is restricted by the direction control pins 80 to the direction perpendicular to the edge 36 of the casing 20 so that the gripping jig 100 is lifted upward, maintaining a horizontal orientation. The circuit substrate 40 secured to the gripping jig 100 is also lifted upward along with the gripping jig 100, maintaining a horizontal orientation. Therefore, the circuit substrate 40 is prevented from being tilted while the circuit substrate 40 is being lifted upward. The signal terminals 24 of the casing 20 are not bent by coming into contact with the opening 50 for terminals of the circuit substrate 40.

In the illustrated example, three direction control pins 80 are fitted into different cover securing holes 26 of the casing 20 to guide the direction in which the gripping jig 100 is pulled out. We conducted experiments with different numbers of direction control pins 80 fitted into the cover securing holes 26 and found that the direction of movement of the gripping jig 100 can be suitably controlled by fitting at least three direction control pins 80 into the cover securing holes 26. It was also found that the gripping jig 100 can be maintained in a horizontal orientation to a certain degree by fitting two direction control pins 80 into the cover securing holes 26 located diagonally opposite to each other.

The guide holes 102 of the gripping jig 100 may be formed of a metal material. By forming the guide holes of a metal material, the direction control pins 80 are prevented from becoming loose in the guide holes 102. For example, the guide holes 102 may be formed by securing a metal collar to the tube 104 made of resin.

(Step of Mounting the Circuit Substrate 40)

A description will now be given of the step of mounting a new circuit substrate 40 to the casing 20 by using the direction control pins 80 and the gripping jig 100.

Figure 14:
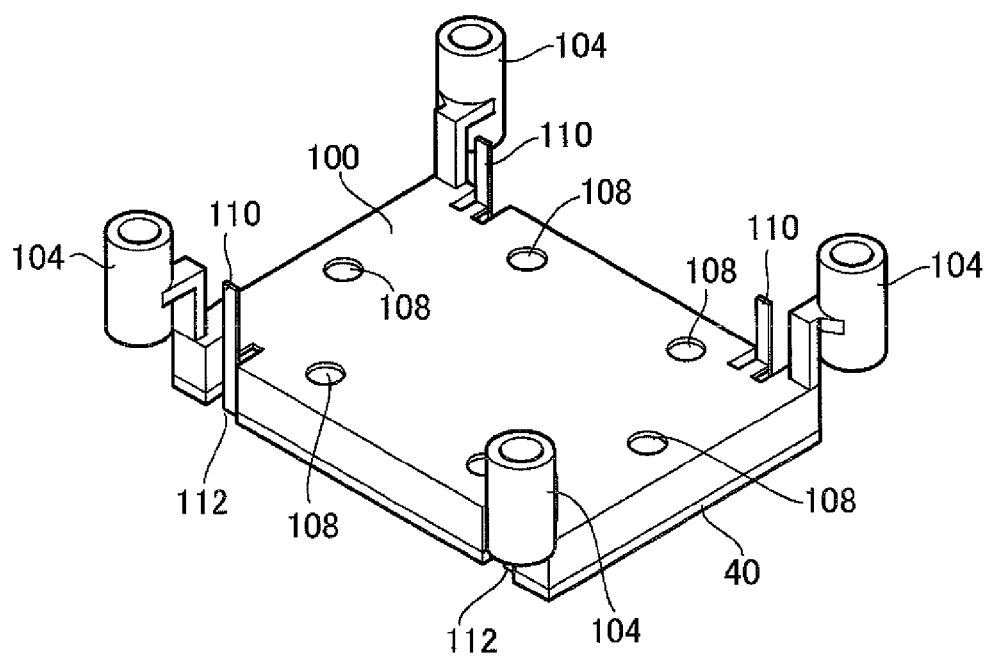
FIG. 14 shows a state in which a new circuit substrate is mounted to the gripping jig.

FIG. 14 shows a state in which a new circuit substrate 40 is mounted to the gripping jig 100. The grips 112 of the gripping jig 100 are latched by the plurality of notches 52 of the circuit substrate 40, allowing the circuit substrate 40 to be gripped by the gripping jig 100.

The operator lifts up the gripping jig 100 gripping the circuit substrate 40 and locates it above the casing 20.

Figure 15:
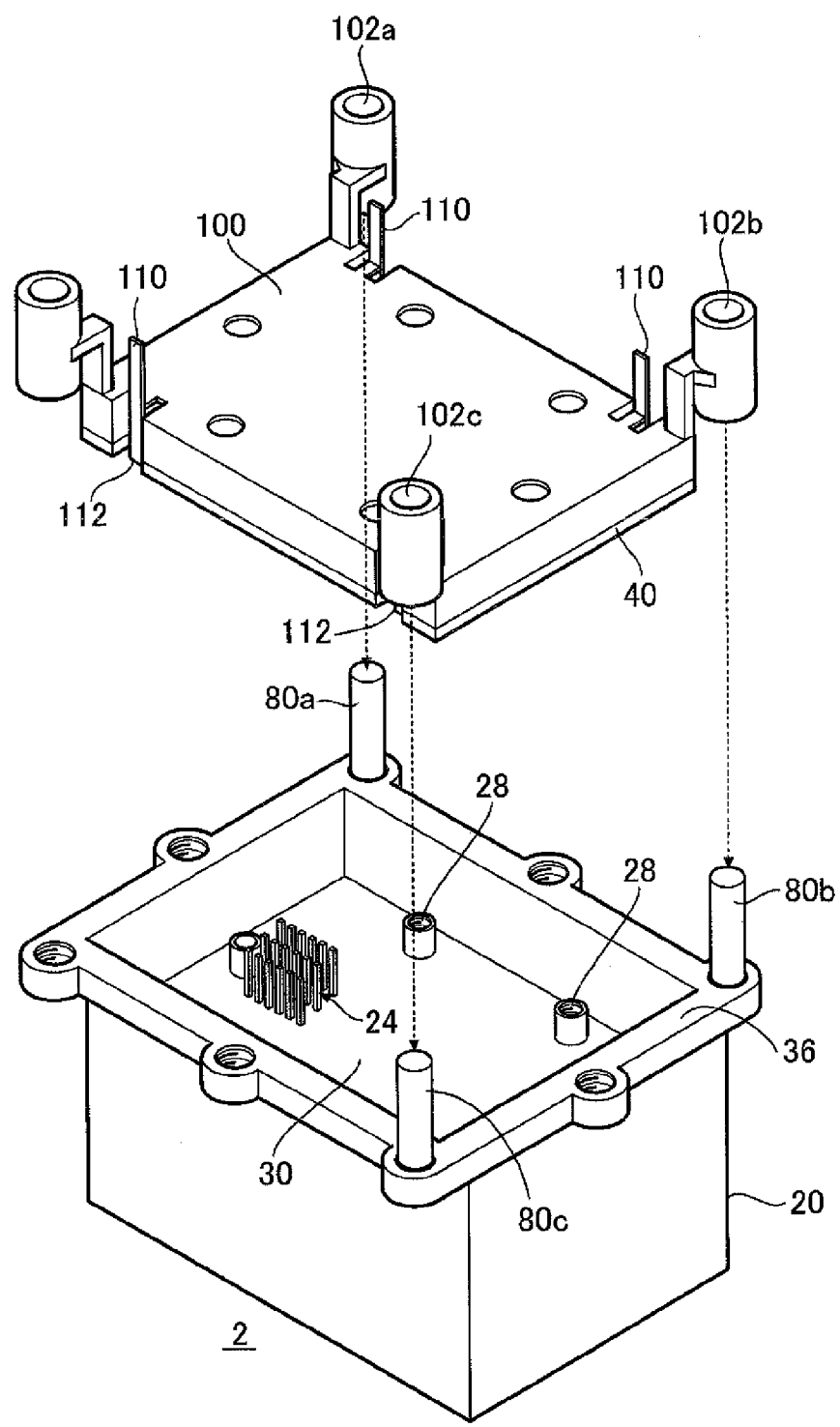
FIG. 15 shows a state in which the gripping jig gripping the circuit substrate is located above the casing.

FIG. 15 shows a state in which the gripping jig 100 gripping the circuit substrate 40 is located above the casing 20. The operator causes the gripping jig 100 to approach the casing 20 slowly so as to insert the direction control pin 80a into the guide hole 102a, the direction control pin 80b into the guide hole 102b, and the direction control pin 80c into the guide hole 102c.

Figure 16:
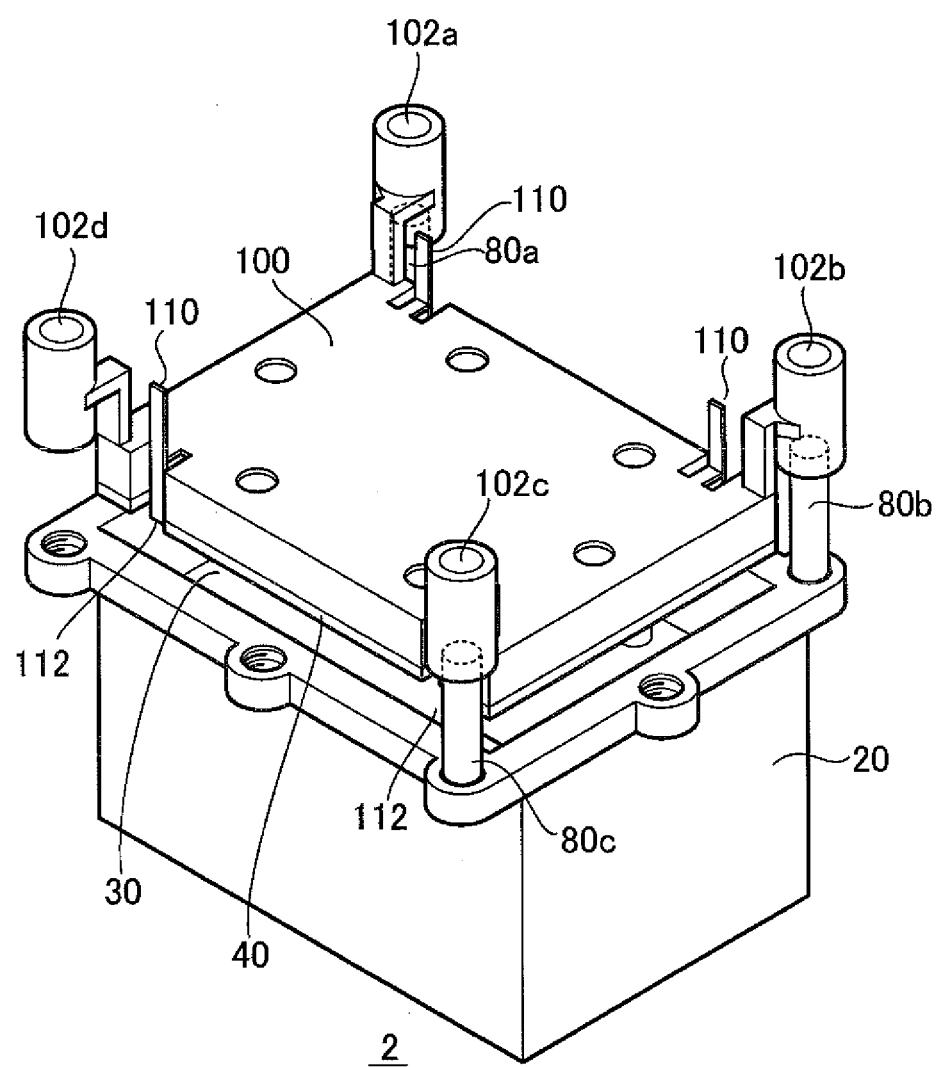
FIG. 16 shows a state in which the direction control pins are partially inserted into the guide holes.

FIG. 16 shows a state in which the direction control pins 80 are partially inserted into the guide holes 102. Since the direction control pins 80 are provided so as to be perpendicular to the edge 36 of the casing 20, the gripping jig 100 is maintained in an orientation perpendicular to the direction control pins 80, i.e., in an orientation horizontal with respect to the casing 20, as the direction control pins 80 are inserted into the guide holes 102. The operator lowers the gripping jig 100 slowly until the underside of the circuit substrate 40 gripped by the gripping jig 100 comes into contact with the top surfaces of the substrate securing holes 28.

The circuit substrate 40 is inserted into the casing 20 along with the gripping jig 100. The gripping jig 100 gripping the circuit substrate 40 is moved along the direction control pins 80 inserted into the guide holes 102. Thereby, the direction of inserting the gripping jig 100 is accurately guided by the direction control pins 80 and the direction of movement of the gripping jig 100 is controlled. In other words, the direction of movement of the gripping jig 100 is restricted by the direction control pins 80 to the direction perpendicular to the edge 36 of the casing 20 so that the gripping jig 100 is lowered, maintaining horizontal orientation. The circuit substrate 40 secured to the gripping jig 100 is also lowered along with the gripping jig 100, maintaining a horizontal orientation. Therefore, the circuit substrate 40 is prevented from being tilted while it is being inserted into the casing 20. This prevents the signal terminals 24 of the casing 20 from being bent by coming into contact with the underside of the circuit substrate 40 and allows the signal terminals 24 to be suitably inserted into the opening 50 for terminals of the circuit substrate 40.

Figure 17:
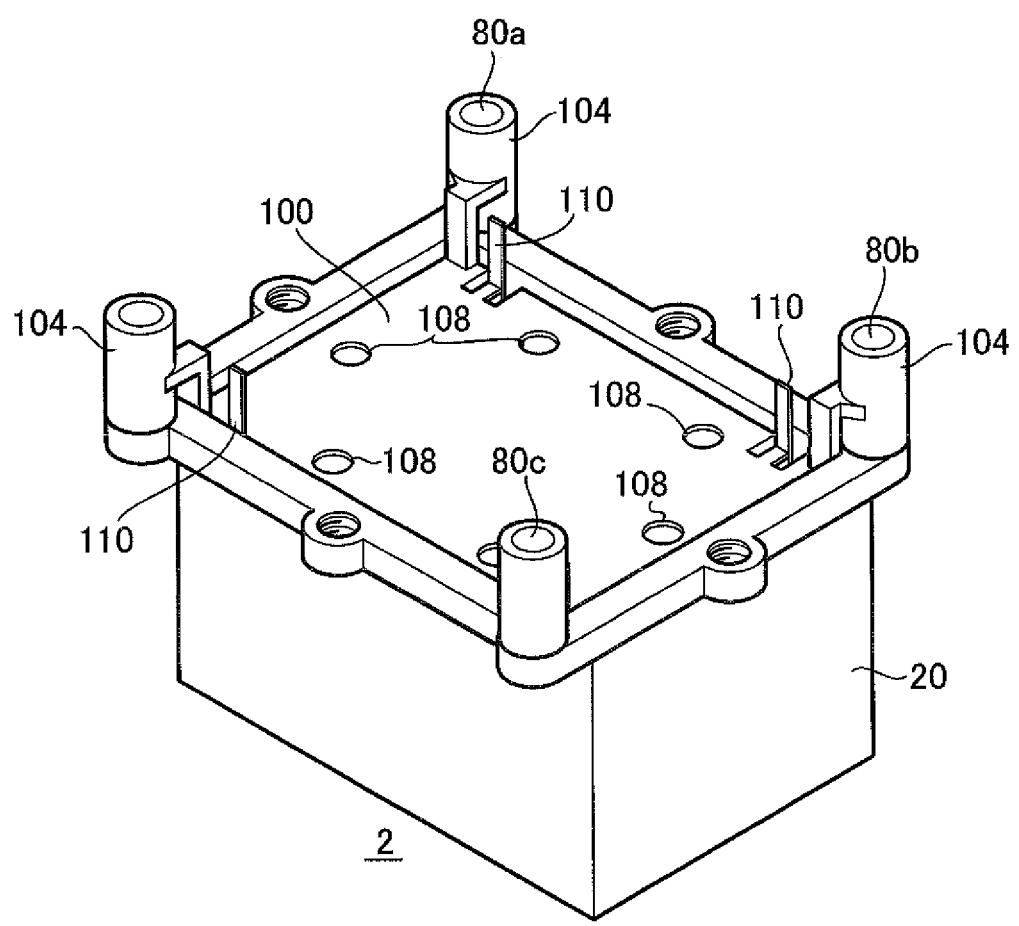
FIG. 17 shows a state in which the underside of the circuit substrate is in contact with the top surfaces of the substrate securing holes.

FIG. 17 shows a state in which the underside of the circuit substrate 40 is in contact with the top surfaces of the substrate securing holes 28. While the circuit substrate 40 is being gripped by the grips 112, the operator fastens the circuit substrate 40 and the casing 20 together via the bolt clearance holes 108, using the bolts 44. By allowing the operator to tighten the bolts 44 while the circuit substrate 40 is being gripped by the grips 112, the precision of the position of the circuit substrate 40 relative to the casing 20 is maintained while the bolts are being tightened.

Once the casing 20 and the circuit substrate 40 are secured to each other using the bolts 44, the operator manipulates the levers 110 to release the circuit substrate 40 from the gripping jig 100. The operator throws all of the levers 110 inward, i.e. such that the levers form acute angles with respect to the top plate 116 of the jig casing. In this process, the grips 112 below the elastic support 118 move in a direction away from the circuit substrate 40, causing the grips 112 to release their grip on the circuit substrate 40.

Figure 18:
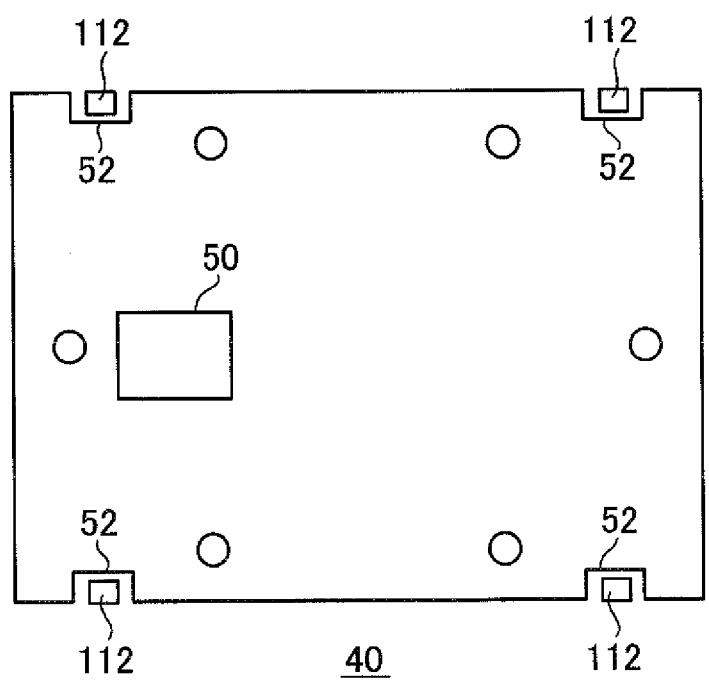
FIG. 18 shows a state in which the grips are removed from the notches on the underside of the circuit substrate.

FIG. 18 shows a state in which the grips 112 are removed from the notches 52 on the underside of the circuit substrate 40. The operator lifts the gripping jig 100 upward while the circuit substrate 40 is released from the grips 112.

Figure 19:
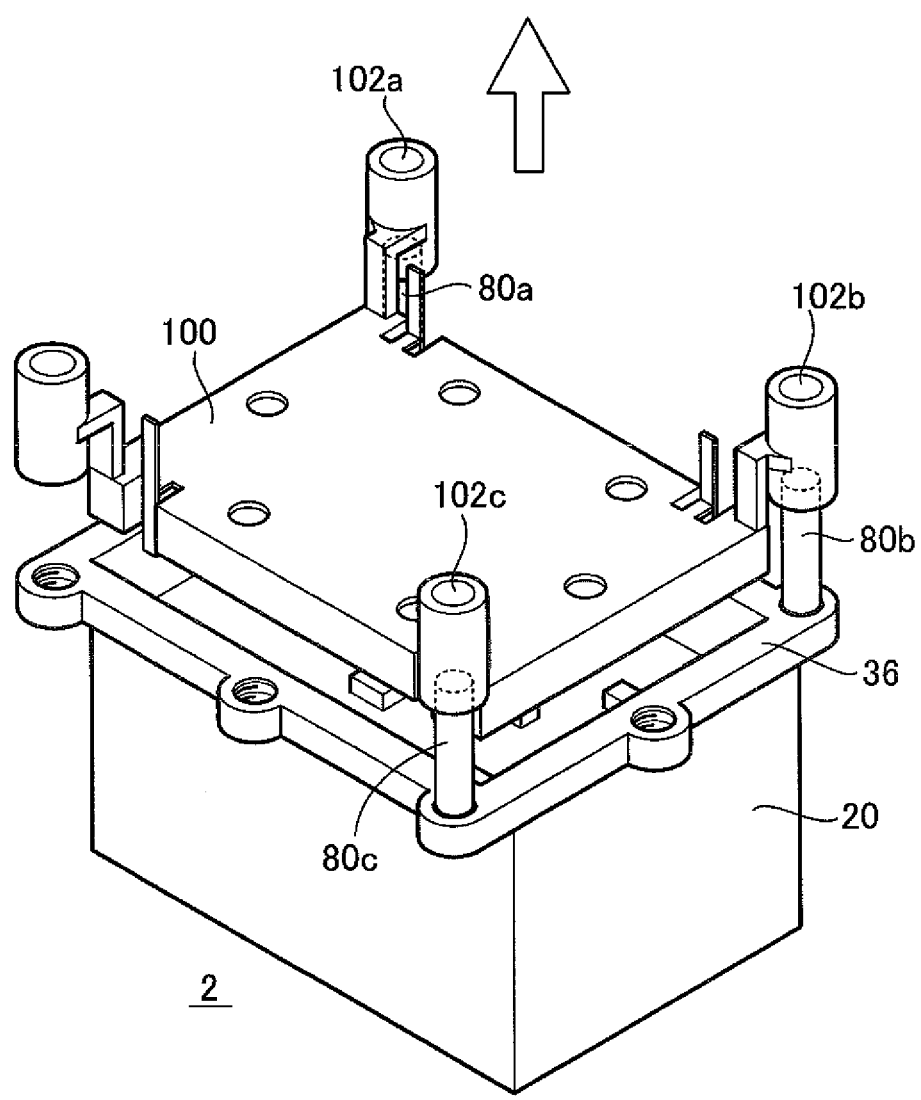
FIG. 19 shows a state in which the gripping jig is lifted upward.

FIG. 19 shows a state in which the gripping jig 100 is lifted upward.

As described above, the orientation maintenance structure of the exemplary embodiment accurately maintains the circuit substrate 40 in horizontal orientation while the circuit substrate 40 is being replaced. Accordingly, the operator can replace the circuit substrate 40 by hand without bending the signal terminals 24 provided to stand on the circuit substrate 40.

Given above is an explanation based on exemplary embodiments. The embodiment is intended to be illustrative only and it will be obvious to those skilled in the art that various modifications to constituting elements and processes could be developed and that such modifications are also within the scope of the present invention. The PCU 2 in the exemplary embodiment is an example of electronic controller. By using the orientation maintenance structure described above in other types of electronic controllers, the operator can replace the circuit substrate 40 easily.

The length of the direction control pins 80 and the guide holes 102 may be defined as appropriate. By increasing the length of the guide holes 102 and the direction control pins 80, the circuit substrate 40 can be maintained in horizontally orientation more properly.

What is claimed is:

1. An orientation maintenance structure that is a structure adapted for an electronic controller in which components secured inside a casing and electronic components on a circuit substrate are electrically connected by a connector, capable of maintaining the orientation of the circuit substrate with respect to the casing when the circuit substrate is removed from the casing or when the circuit substrate is mounted to the casing, the structure comprising:
   a plurality of direction control pins fitted into cover securing holes provided in the casing to secure a cover to the casing; and
   a gripping jig including a plurality of grips for gripping the circuit substrate and a plurality of guide holes into which the direction control pins are inserted, wherein
   the direction of movement of the gripping jig is controlled by the direction control pins inserted into the guide holes.

2. The orientation maintenance structure according to claim 1, wherein
   at least three direction control pins are fitted into different cover securing holes.

3. The orientation maintenance structure according to claim 1, wherein
   the grip is supported by the gripping jig so as to be elastically deformable and grips an edge of the circuit substrate.

4. The orientation maintenance structure according to claim 1, wherein
   the guide hole of the gripping jig is formed of a metal material.

* * * * *